United States Patent
Lin et al.

(10) Patent No.: US 9,425,754 B2
(45) Date of Patent: Aug. 23, 2016

(54) REPAIR OPERATIONAL AMPLIFIER CIRCUIT AND OPERATING METHOD THEREOF

(71) Applicant: Raydium Semiconductor Corporation, Hsinchu (TW)

(72) Inventors: Po-Cheng Lin, Hsinchu (TW); Yu-Lung Lo, New Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 262 days.

(21) Appl. No.: 14/321,344

(22) Filed: Jul. 1, 2014

(65) Prior Publication Data
US 2015/0008981 A1    Jan. 8, 2015

(30) Foreign Application Priority Data

Jul. 5, 2013    (TW) .............................. 102124226

(51) Int. Cl.
G09G 5/00    (2006.01)
H03F 3/45    (2006.01)
G02F 1/1362    (2006.01)

(52) U.S. Cl.
CPC ...... *H03F 3/45475* (2013.01); *G02F 1/136259* (2013.01); *G02F 2001/136263* (2013.01); *H03F 2203/45248* (2013.01)

(58) Field of Classification Search
None
See application file for complete search history.

(56) References Cited

U.S. PATENT DOCUMENTS

2012/0149274 A1* 6/2012 Zhao ..................... G09G 3/006
445/2

* cited by examiner

*Primary Examiner* — Adam R Giesy

(57) ABSTRACT

A repair operational amplifier circuit including a repair operational amplifier and a slew rate enhancing module. The repair operational amplifier includes an input terminal and an output terminal. The input terminal is used to receive an input signal. The output terminal is used to output an output signal. The slew rate enhancing module is coupled to the input terminal and the output terminal of the repair operational amplifier and used to selectively control the repair operational amplifier to increase a slew rate of the output signal according to whether the slew rate of the output signal is smaller than a default slew rate.

10 Claims, 5 Drawing Sheets

# REPAIR OPERATIONAL AMPLIFIER CIRCUIT AND OPERATING METHOD THEREOF

BACKGROUND OF THE INVENTION

1. Field of the Invention

This invention relates to a repair operational amplifier (ROA) circuit, especially to the ROA circuit and operating method thereof applied in a liquid crystal display panel.

2. Description of the Related Art

With the development of liquid crystal display technology, the liquid crystal display has been widely used in different regions. As shown in FIG. 1, when a liquid crystal display panel LCP displays a picture, there may be a line broken on the liquid crystal display panel LCP and the signal transmission will be failed. At this time, the liquid crystal display panel LCP needs a repair operational amplifier (ROA) circuit 1 to repair the broken line. However, since different lines (e.g., P1, P2) on the liquid crystal display panel LCP could be broken at different times, repairing paths of repair operational amplifiers ROP1 and ROP2 of the ROA circuit 1 could be also different. In addition, parasitic resistances and parasitic capacitances in the repairing paths could be different, so that signal transmission rates could be also different, as shown in FIG. 2, and the line repairing failure probability of the repair operational amplifier will be increased, errors will be occurred when the liquid crystal display panel LCP displays the picture. Especially, the variation of parasitic capacitance is more trouble than the variation of parasitic resistance because the variation of parasitic resistance can be overcome by increasing a line repairing diameter, but the variation of parasitic capacitance cannot be overcome by doing so.

SUMMARY OF THE INVENTION

Therefore, the invention provides a repair operational amplifier circuit and operating method thereof applied in a liquid crystal display panel to solve the above-mentioned problems.

An embodiment of the invention is a repair operational amplifier circuit. In this embodiment, the repair operational amplifier circuit includes a repair operational amplifier and a slew rate enhancing module. The repair operational amplifier includes an input terminal and an output terminal. The input terminal is used to receive an input signal. The output terminal is used to output an output signal. The slew rate enhancing module is coupled to the input terminal and the output terminal of the repair operational amplifier and used to selectively control the repair operational amplifier to increase a slew rate of the output signal according to whether the slew rate of the output signal is smaller than a default slew rate.

In an embodiment, the slew rate enhancing module includes a sensing unit, a determining unit, and an enhancing unit. The sensing unit is coupled to the input terminal and the output terminal of the repair operational amplifier and used for sensing the input signal and the output signal at the input terminal and the output terminal respectively. The determining unit is coupled to the sensing unit and used for determining whether the slew rate of the output signal is smaller than the default slew rate. If yes, the determining unit outputs an enhancing signal. The enhancing unit is coupled to the determining unit and the repair operational amplifier and used for controlling the repair operational amplifier to increase the slew rate of the output signal outputted by the output terminal according to the enhancing signal.

In an embodiment, the repair operational amplifier circuit is applied in a liquid crystal display panel, the repair operational amplifier circuit further includes another repair operational amplifier and another slew rate enhancing module, the repair operational amplifier and the another repair operational amplifier are coupled to a first broken line location and a second broken line location of the liquid crystal display panel respectively.

In an embodiment, the first broken line location and the second broken line location of the liquid crystal display panel have different parasitic resistances and different parasitic capacitances respectively, so that the slew rate of the output signal outputted by the repair operational amplifier is different from another slew rate of another output signal outputted by the another repair operational amplifier.

In an embodiment, the another slew rate enhancing module selectively controls the another repair operational amplifier to increase the another slew rate of the another output signal according to whether the another slew rate of the another output signal is smaller than the default slew rate, so that the slew rate of the output signal outputted by the repair operational amplifier is the same with the another slew rate of the another output signal outputted by the another repair operational amplifier.

Another embodiment of the invention is a repair operational amplifier circuit operating method. In this embodiment, the repair operational amplifier circuit operating method is used for operating a repair operational amplifier circuit including a repair operational amplifier and a slew rate enhancing module. The method includes steps of: (a) the slew rate enhancing module sensing an input signal received by an input terminal of the repair operational amplifier and an output signal outputted by an output terminal of the repair operational amplifier respectively; and (b) the slew rate enhancing module selectively controlling the repair operational amplifier to increase a slew rate of the output signal according to whether the slew rate of the output signal is smaller than a default slew rate.

Compared to the prior art, the repair operational amplifier circuit and operating method thereof in the invention is applied to signal compensation of the liquid crystal display panel and the repair operational amplifier uses its slew rate adjusting circuit to detect the input signal of its input terminal and the output signal of its output terminal respectively. Once the slew rate adjusting circuit detects that the rate of the output signal of the output terminal is too slow, the slew rate adjusting circuit will transmit a slew rate enhancing signal to drive the repair operational amplifier to increase the slew rate of the output signal of the output terminal to make the transmission rates of signals converge to reduce the line repairing failure probability of the repair operational amplifier, so that the liquid crystal display panel can display a picture without any errors.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A preferred embodiment of the invention is a repair operational amplifier circuit. In this embodiment, the repair operational amplifier circuit includes at least one set of repair operational amplifier and slew rate enhancing module and used to repair at least one broken line on a liquid crystal display panel to make the liquid crystal display panel display pictures without any errors.

Figure 1:
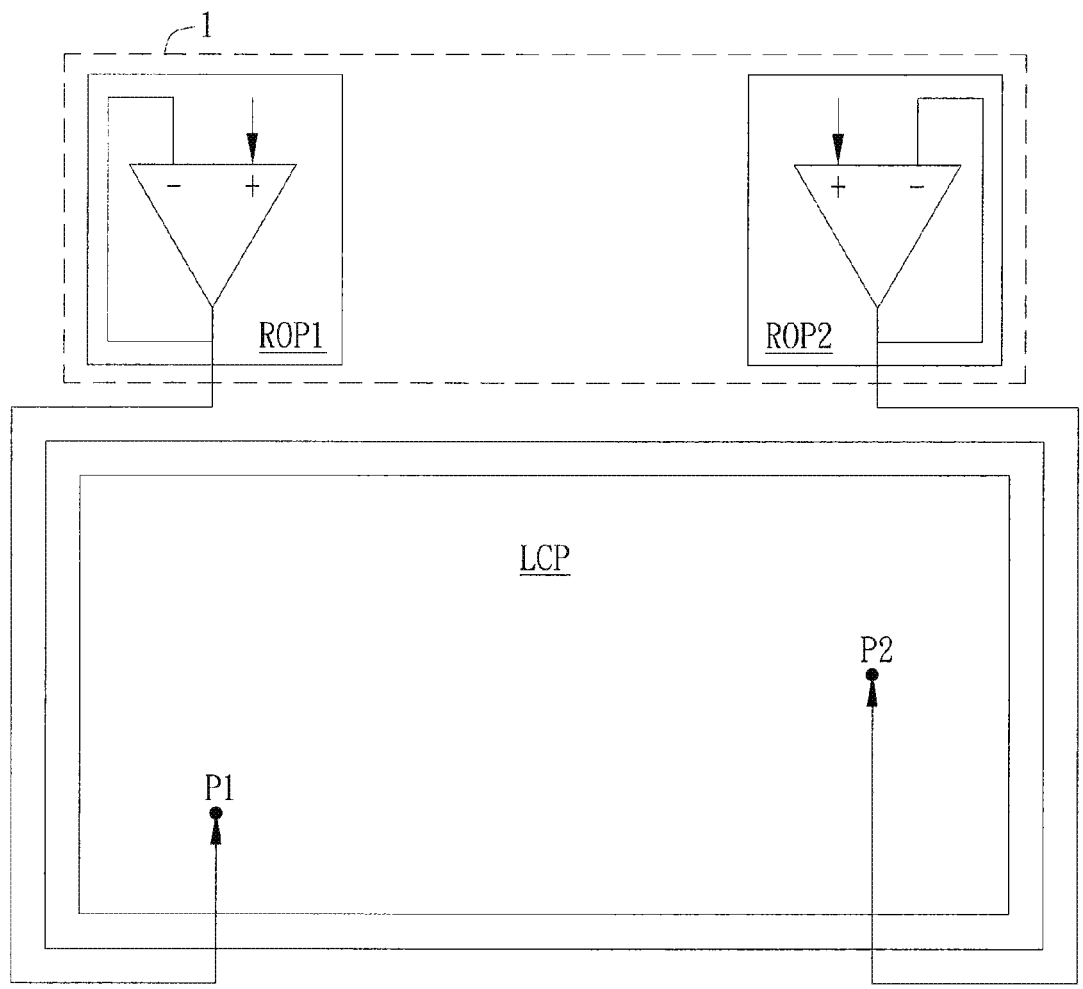
FIG. 1 illustrates a schematic diagram of the conventional two repair operational amplifiers of the repair operational amplifier circuit repairing two different broken lines on the liquid crystal display panel respectively.
Figure 2:
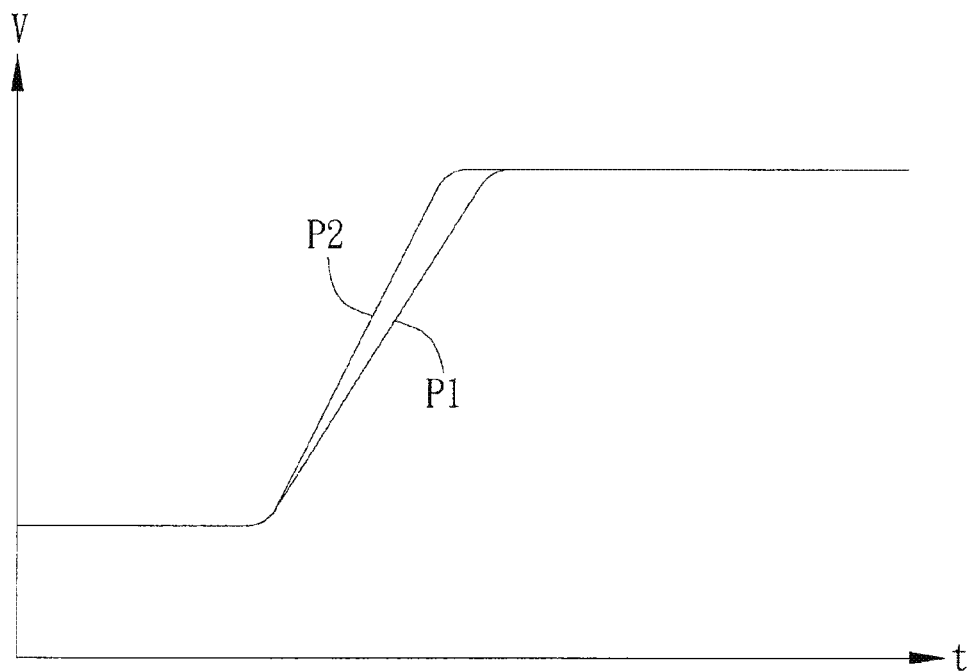
FIG. 2 illustrates a schematic diagram of different slew rates of the two output signals of the two repair operational amplifiers shown in FIG. 1.
Figure 3:
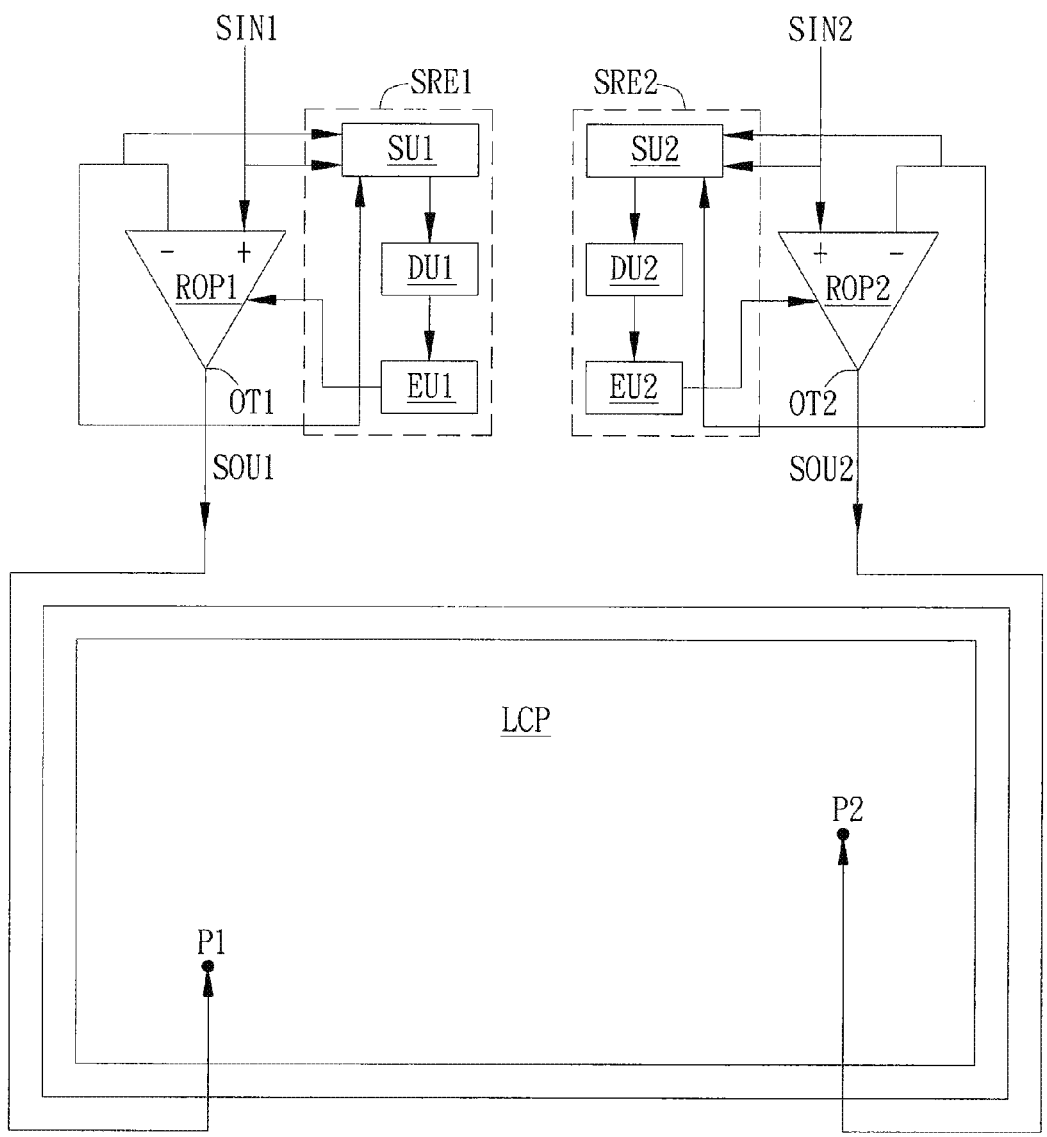
FIG. 3 illustrates a schematic diagram of the repair operational amplifier circuit repairing two different broken lines on the liquid crystal display panel respectively in an embodiment of the invention.

Please refer to FIG. 3. FIG. 3 illustrates a schematic diagram of the repair operational amplifier circuit repairing two different broken lines on the liquid crystal display panel respectively in this embodiment. As shown in FIG. 3, the repair operational amplifier circuit 3 includes a first set of repair operational amplifier ROP1 and slew rate enhancing module SRE1 and a second set of repair operational amplifier ROP2 and slew rate enhancing module SRE2. The first set of repair operational amplifier ROP1 and slew rate enhancing module SRE1 is coupled to a first broken line P1 on the liquid crystal display panel LCP to repair the first broken line P1. The second set of repair operational amplifier ROP2 and slew rate enhancing module SRE2 is coupled to a second broken line P2 on the liquid crystal display panel LCP to repair the second broken line P2.

It should be noticed that because the first broken line P1 and the second broken line P2 on the liquid crystal display panel LCP could have different parasitic resistances and parasitic capacitances respectively, the slew rates of the output signals outputted by the repair operational amplifiers ROP1 and ROP2 could be also different. Therefore, the repair operational amplifier circuit 3 uses the first set of repair operational amplifier ROP1 and slew rate enhancing module SRE1 and the second set of repair operational amplifier ROP2 and slew rate enhancing module SRE2 to reduce the difference between the slew rates of output signals outputted by the repair operational amplifiers ROP1 and ROP2.

Firstly, the first set of repair operational amplifier ROP1 and slew rate enhancing module SRE1 is taken as an example. The repair operational amplifier ROP1 includes a positive input terminal +, a negative input terminal −, and an output terminal OT1. The output terminal OT1 is used to output a first output signal SOUT1. The positive input terminal + and the negative input terminal − are used to receive a first input signal SIN1 and a first output signal SOUT1 respectively. The slew rate enhancing module SRE1 is coupled to the positive input terminal +, the negative input terminal −, and the output terminal OT1 of the repair operational amplifier ROP1 and used to selectively control the repair operational amplifier ROP1 to increase the slew rate of the first output signal SOUT1 according to whether the slew rate of the first output signal SOUT1 is smaller than a default slew rate.

In this embodiment, the slew rate enhancing module SRE1 includes a sensing unit SU1, a determining unit DU1, and an enhancing unit EU1. Wherein, the sensing unit SU1 is coupled to the positive input terminal +, the negative input terminal −, and the output terminal OT1 of the repair operational amplifier ROP1 and used to sense the first input signal SIN1 and the first output signal SOUT1 respectively. The determining unit DU1 is coupled to the sensing unit SU1 and used to determine whether the slew rate of the first output signal SOUT1 is smaller than the default slew rate. If the determining unit DU1 determines that the slew rate of the first output signal SOUT1 is smaller than the default slew rate, the determining unit DU1 transmits an enhancing signal to the enhancing unit EU1. The enhancing unit EU1 is coupled to the determining unit DU1 and the repair operational amplifier ROP1 and used to control the repair operational amplifier ROP1 increase the slew rate of the first output signal SOUT1 outputted by the output terminal OT1.

Similarly, the second set of repair operational amplifier ROP2 and slew rate enhancing module SRE2 is taken as another example. The repair operational amplifier ROP2 includes a positive input terminal +, a negative input terminal −, and an output terminal OT2. The output terminal OT2 is used to output a second output signal SOUT2. The positive input terminal + and the negative input terminal − are used to receive a second input signal SIN2 and a second output signal SOUT2 respectively. The slew rate enhancing module SRE2 is coupled to the positive input terminal +, the negative input terminal −, and the output terminal OT2 of the repair operational amplifier ROP2 and used to selectively control the repair operational amplifier ROP2 to increase the slew rate of the second output signal SOUT2 according to whether the slew rate of the second output signal SOUT2 is smaller than the default slew rate.

In this embodiment, the slew rate enhancing module SRE2 includes a sensing unit SU2, a determining unit DU2, and an enhancing unit EU2. Wherein, the sensing unit SU2 is coupled to the positive input terminal +, the negative input terminal −, and the output terminal OT2 of the repair operational amplifier ROP2 and used to sense the first input signal SIN2 and the first output signal SOUT2 respectively. The determining unit DU2 is coupled to the sensing unit SU2 and used to determine whether the slew rate of the first output signal SOUT2 is smaller than the default slew rate. If the determining unit DU1 determines that the slew rate of the first output signal SOUT2 is smaller than the default slew rate, the determining unit DU2 transmits an enhancing signal to the enhancing unit EU2. The enhancing unit EU2 is coupled to the determining unit DU2 and the repair operational amplifier ROP2 and used to control the repair operational amplifier ROP2 increase the slew rate of the first output signal SOUT2 outputted by the output terminal OT2.

Figure 4:
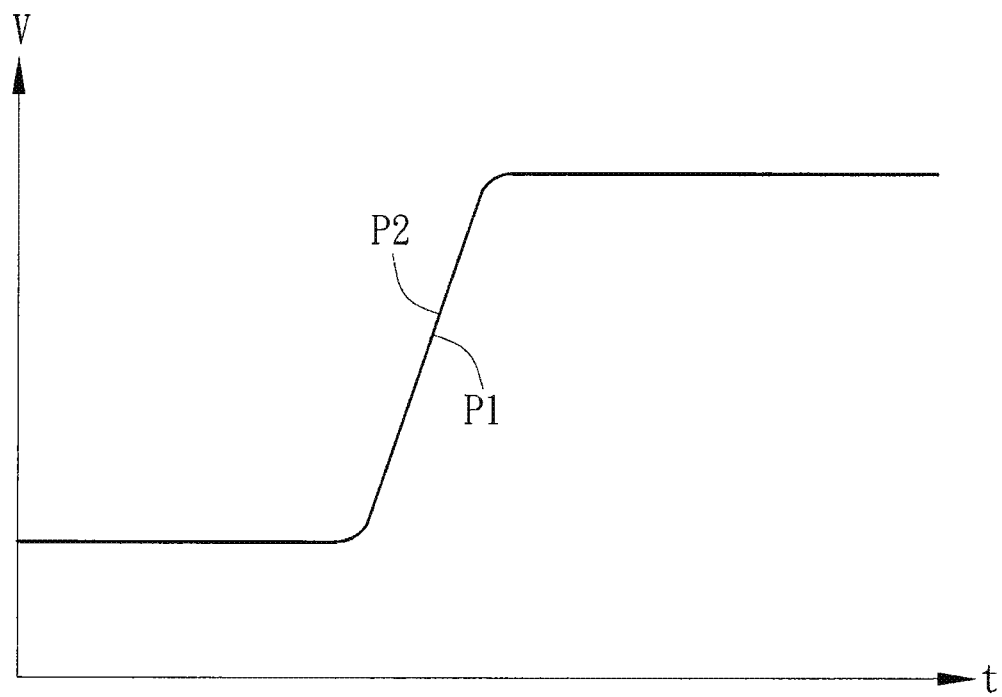
FIG. 4 illustrates a schematic diagram of the same slew rate of the two output signals of the two repair operational amplifiers shown in FIG. 3.

After the operations are performed mentioned above, as shown in FIG. 4, the two output signals SOUT1 and SOUT2 of the two repair operational amplifiers ROP1 and ROP2 have the same slew rate. It can be found that with the operations of the first set of repair operational amplifier ROP1 and slew rate enhancing module SRE1 and the second set of repair operational amplifier ROP2 and slew rate enhancing module SRE2, the repair operational amplifier circuit 3 of the invention can effectively overcome the slew rate difference between the output signals due to the different parasitic resistances and parasitic capacitances in different repairing paths when the conventional repair operational amplifier repairs different broken lines. Therefore, the line repairing failure probability of the repair operational amplifier circuit 3 can be reduced, so that the liquid crystal display panel LCP can display pictures without any errors.

Another embodiment of the invention is a repair operational amplifier circuit operating method. In this embodiment, the repair operational amplifier circuit operating method is used for operating a repair operational amplifier circuit including a repair operational amplifier and a slew rate enhancing module.

Figure 5:
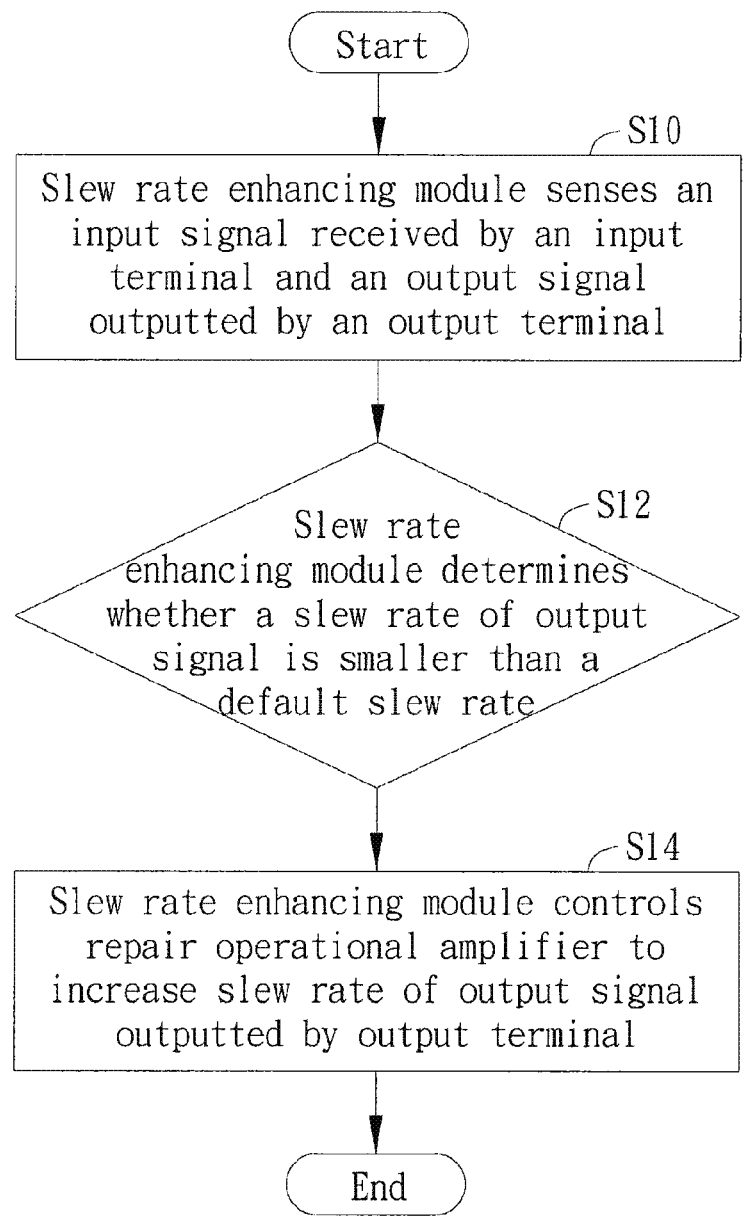
FIG. 5 illustrates a flowchart of the repair operational amplifier circuit operating method in another embodiment of the invention.

Please refer to FIG. 5. FIG. 5 illustrates a flowchart of the repair operational amplifier circuit operating method in this embodiment. As shown in FIG. 5, in the step S10, the slew rate enhancing module senses an input signal received by an input terminal of the repair operational amplifier and an output signal outputted by an output terminal of the repair operational amplifier respectively. In the step S12, the slew rate enhancing module determines whether a slew rate of the output signal is smaller than a default slew rate. If the determined result of the step S12 is yes, the slew rate enhancing module controls the repair operational amplifier to increase the slew rate of the output signal outputted by the output terminal.

In practical applications, the repair operational amplifier circuit is applied in a liquid crystal display panel. The repair operational amplifier circuit further includes another repair operational amplifier and another slew rate enhancing module. The repair operational amplifier and the another repair operational amplifier are coupled to a first broken line location and a second broken line location of the liquid crystal display panel respectively.

Because the first broken line location and the second broken line location of the liquid crystal display panel have different parasitic resistances and different parasitic capacitances respectively, the slew rate of the output signal outputted by the repair operational amplifier is different from another slew rate of another output signal outputted by the another repair operational amplifier. Therefore, the another slew rate enhancing module will selectively control the another repair operational amplifier to increase the another slew rate of the another output signal according to whether the another slew rate of the another output signal is smaller than the default slew rate, so that the slew rate of the output signal outputted by the repair operational amplifier will be the same with the another slew rate of the another output signal outputted by the another repair operational amplifier.

Compared to the prior art, the repair operational amplifier circuit and operating method thereof in the invention is applied to signal compensation of the liquid crystal display panel and the repair operational amplifier uses its slew rate adjusting circuit to detect the input signal of its input terminal and the output signal of its output terminal respectively. Once the slew rate adjusting circuit detects that the rate of the output signal of the output terminal is too slow, the slew rate adjusting circuit will transmit a slew rate enhancing signal to drive the repair operational amplifier to increase the slew rate of the output signal of the output terminal to make the transmission rates of signals converge to reduce the line repairing failure probability of the repair operational amplifier, so that the liquid crystal display panel can display a picture without any errors.

With the example and explanations above, the features and spirits of the invention will be hopefully well described.

Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A repair operational amplifier circuit, comprising:
   a repair operational amplifier having an input terminal and an output terminal, wherein the input terminal receives an input signal and the output terminal outputs an output signal; and
   a slew rate enhancing module, coupled to the input terminal and the output terminal of the repair operational amplifier, for selectively controlling the repair operational amplifier to increase a slew rate of the output signal according to whether the slew rate of the output signal is smaller than a default slew rate.

2. The repair operational amplifier circuit of claim 1, wherein the slew rate enhancing module comprises:
   a sensing unit, coupled to the input terminal and the output terminal of the repair operational amplifier, for sensing the input signal and the output signal at the input terminal and the output terminal respectively;
   a determining unit, coupled to the sensing unit, for determining whether the slew rate of the output signal is smaller than the default slew rate, if yes, the determining unit outputting an enhancing signal; and
   an enhancing unit, coupled to the determining unit and the repair operational amplifier, for controlling the repair operational amplifier to increase the slew rate of the output signal outputted by the output terminal according to the enhancing signal.

3. The repair operational amplifier circuit of claim 1, wherein the repair operational amplifier circuit is applied in a liquid crystal display panel, the repair operational amplifier circuit further comprising another repair operational amplifier and another slew rate enhancing module, the repair operational amplifier and the another repair operational amplifier are coupled to a first broken line location and a second broken line location of the liquid crystal display panel respectively.

4. The repair operational amplifier circuit of claim 3, wherein the first broken line location and the second broken line location of the liquid crystal display panel have different parasitic resistances and different parasitic capacitances respectively, so that the slew rate of the output signal outputted by the repair operational amplifier is different from another slew rate of another output signal outputted by the another repair operational amplifier.

5. The repair operational amplifier circuit of claim 4, wherein the another slew rate enhancing module selectively controls the another repair operational amplifier to increase the another slew rate of the another output signal according to whether the another slew rate of the another output signal is smaller than the default slew rate, so that the slew rate of the output signal outputted by the repair operational amplifier is the same with the another slew rate of the another output signal outputted by the another repair operational amplifier.

6. A repair operational amplifier circuit operating method, for operating a repair operational amplifier circuit comprising a repair operational amplifier and a slew rate enhancing module, the method comprising steps of:
   (a) the slew rate enhancing module sensing an input signal received by an input terminal of the repair operational amplifier and an output signal outputted by an output terminal of the repair operational amplifier respectively; and (b) the slew rate enhancing module selectively controlling the repair operational amplifier to increase a slew rate of the output signal according to whether the slew rate of the output signal is smaller than a default slew rate.

7. The repair operational amplifier circuit operating method of claim 6, wherein the step (b) comprises:

(b1) determining whether the slew rate of the output signal is smaller than the default slew rate; and (b2) if the determined result of the step (b1) is yes, controlling the repair operational amplifier to increase the slew rate of the output signal outputted by the output terminal.

8. The repair operational amplifier circuit operating method of claim 6, wherein the repair operational amplifier circuit is applied in a liquid crystal display panel, the repair operational amplifier circuit further comprising another repair operational amplifier and another slew rate enhancing module, the repair operational amplifier and the another repair operational amplifier are coupled to a first broken line location and a second broken line location of the liquid crystal display panel respectively.

9. The repair operational amplifier circuit operating method of claim 8, wherein the first broken line location and the second broken line location of the liquid crystal display panel have different parasitic resistances and different parasitic capacitances respectively, so that the slew rate of the output signal outputted by the repair operational amplifier is different from another slew rate of another output signal outputted by the another repair operational amplifier.

10. The repair operational amplifier circuit operating method of claim 9, wherein the another slew rate enhancing module selectively controls the another repair operational amplifier to increase the another slew rate of the another output signal according to whether the another slew rate of the another output signal is smaller than the default slew rate, so that the slew rate of the output signal outputted by the repair operational amplifier is the same with the another slew rate of the another output signal outputted by the another repair operational amplifier.

* * * * *